United States Patent
Hall et al.

(10) Patent No.: US 7,851,907 B2
(45) Date of Patent: Dec. 14, 2010

(54) SEMICONDUCTOR INTEGRATED CIRCUIT PACKAGE HAVING ELECTRICALLY DISCONNECTED SOLDER BALLS FOR MOUNTING

(75) Inventors: Frank L. Hall, Boise, ID (US); Cary J. Baerlocher, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 325 days.

(21) Appl. No.: 12/022,211

(22) Filed: Jan. 30, 2008

(65) Prior Publication Data

US 2008/0142950 A1    Jun. 19, 2008

Related U.S. Application Data

(62) Division of application No. 11/428,625, filed on Jul. 5, 2006, now Pat. No. 7,342,319, which is a division of application No. 10/123,827, filed on Apr. 15, 2002, now Pat. No. 7,276,802.

(51) Int. Cl.
*H01L 23/34* (2006.01)
(52) U.S. Cl. .................. 257/723; 257/773; 257/776; 257/778; 257/784; 257/E25.005; 257/E25.01; 257/E25.012; 257/E25.016; 257/E25.02; 257/E25.026; 257/E23.02; 257/E23.021
(58) Field of Classification Search ......... 257/678–733, 257/737, 738, 777–796, E23.001–E23.194; 438/612–617
See application file for complete search history.

(56) References Cited

U.S. PATENT DOCUMENTS

| 5,311,059 | A | | 5/1994 | Banerji et al. |
| 5,400,950 | A | * | 3/1995 | Myers et al. ........... 228/180.22 |
| 5,410,181 | A | | 4/1995 | Zollo et al. |

(Continued)

FOREIGN PATENT DOCUMENTS

GB         2345191        6/2000

(Continued)

OTHER PUBLICATIONS

Fan, L. , et al., "Incorporation of Inorganic Filler into the No-Flow Underfill Material for Flip-Chip Application", *International Symposium on Advanced Packaging Materials*,(2000),303-310.

*Primary Examiner*—Jasmine J Clark
(74) *Attorney, Agent, or Firm*—Schwegman, Lundberg & Woessner, P.A.

(57) ABSTRACT

Integrated circuit packages that connect solder balls between solder ball pads of a die and substrate pads of a printed circuit board (PCB). The solder balls are electrically disconnected from any circuit of the die, i.e., "dummy" solder balls, and are used to temporarily hold the die in position with respect to the PCB until the circuit is wire bonded and an underfill material is cured between the die and the PCB to more permanently connect them together. The underfill material is selected to have a coefficient of thermal expansion (CTE) that is substantially equal to the CTE of the solder balls to prevent thermal mismatch problems. An overmolding compound is disposed about the die and the underfill material and about the wire bonds to complete the package. Various arrangements of the solder ball pads on the die include columnar and row, corner, diagonal, cross, and periphery arrangements.

20 Claims, 11 Drawing Sheets

U.S. PATENT DOCUMENTS

| | | | |
|---|---|---|---|
| 5,748,450 | A | 5/1998 | Kim et al. |
| 5,811,317 | A | 9/1998 | Maheshwari et al. |
| 5,898,224 | A | 4/1999 | Akram |
| RE36,325 | E | 10/1999 | Corbett et al. |
| 5,994,166 | A | 11/1999 | Akram et al. |
| 6,008,071 | A * | 12/1999 | Karasawa et al. ............ 438/115 |
| 6,048,755 | A | 4/2000 | Jiang et al. |
| 6,051,878 | A | 4/2000 | Akram et al. |
| 6,084,297 | A | 7/2000 | Brooks et al. |
| 6,121,576 | A | 9/2000 | Hembree |
| 6,127,724 | A | 10/2000 | DiStefano |
| 6,150,724 | A * | 11/2000 | Wenzel et al. ............... 257/777 |
| 6,160,715 | A | 12/2000 | Degani et al. |
| 6,175,157 | B1 | 1/2001 | Morifuji |
| 6,198,162 | B1 | 3/2001 | Corisis |
| 6,208,156 | B1 | 3/2001 | Hembree |
| 6,214,716 | B1 | 4/2001 | Akram |
| 6,222,265 | B1 | 4/2001 | Akram et al. |
| 6,225,702 | B1 | 5/2001 | Nakamura |
| 6,232,666 | B1 | 5/2001 | Corisis et al. |
| 6,258,626 | B1 | 7/2001 | Wang et al. |
| 6,326,244 | B1 | 12/2001 | Brooks et al. |
| 6,329,222 | B1 | 12/2001 | Corisis et al. |
| 6,329,637 | B1 | 12/2001 | Hembree et al. |
| 6,391,762 | B1 | 5/2002 | Gamota et al. |
| 6,400,574 | B1 | 6/2002 | Stephenson et al. |
| 6,462,420 | B2 | 10/2002 | Hikita et al. |
| 6,500,764 | B1 | 12/2002 | Pritchett |
| 6,503,781 | B2 | 1/2003 | Stephenson et al. |
| 6,504,389 | B1 | 1/2003 | Hembree et al. |
| 6,507,114 | B2 | 1/2003 | Hui et al. |
| 6,522,018 | B1 | 2/2003 | Tay et al. |
| 6,533,159 | B1 | 3/2003 | Cobbley et al. |
| 6,559,537 | B1 | 5/2003 | Bolken et al. |
| 6,576,495 | B1 | 6/2003 | Jiang et al. |
| 6,576,496 | B1 | 6/2003 | Bolken et al. |
| 6,577,004 | B1 | 6/2003 | Rumsey et al. |
| 6,583,502 | B2 | 6/2003 | Lee et al. |
| 6,595,408 | B1 | 7/2003 | Cobbley et al. |
| 6,599,822 | B1 | 7/2003 | Akram |
| 6,600,335 | B2 | 7/2003 | Tay et al. |
| 6,602,733 | B2 | 8/2003 | Iwahashi et al. |
| 6,603,071 | B2 | 8/2003 | Takao |
| 6,638,792 | B2 | 10/2003 | Hui et al. |
| 6,646,286 | B1 | 11/2003 | Akram |
| 6,660,558 | B1 | 12/2003 | Boken et al. |
| 6,661,103 | B2 | 12/2003 | Akram |
| 6,661,104 | B2 * | 12/2003 | Jiang et al. .................. 257/789 |
| 6,680,213 | B2 | 1/2004 | Farnworth et al. |
| 6,687,989 | B1 | 2/2004 | Farnworth et al. |
| 6,700,183 | B2 | 3/2004 | Jiang |
| 6,724,084 | B1 | 4/2004 | Hitika et al. |
| 6,736,306 | B2 | 5/2004 | Byun et al. |
| 6,750,552 | B1 | 6/2004 | Narayanan |
| 6,762,495 | B1 | 7/2004 | Reyes et al. |
| 6,778,404 | B1 | 8/2004 | Bolken et al. |
| 6,781,245 | B2 | 8/2004 | Huang |
| 6,825,569 | B2 | 11/2004 | Jiang et al. |
| 6,889,430 | B2 | 5/2005 | Jiang et al. |
| 7,268,067 | B2 | 9/2007 | Hall et al. |
| 7,276,802 | B2 | 10/2007 | Hall et al. |
| 7,342,319 | B2 | 3/2008 | Hall et al. |
| 7,468,559 | B2 | 12/2008 | Hall et al. |
| 2002/0096784 | A1 * | 7/2002 | Kamikuri et al. ............ 257/778 |
| 2002/0100976 | A1 | 8/2002 | Hui et al. |
| 2002/0114135 | A1 | 8/2002 | Akram et al. |
| 2002/0149298 | A1 | 10/2002 | Furukawa et al. |
| 2002/0167077 | A1 | 11/2002 | Vincent |
| 2002/0187590 | A1 | 12/2002 | Bolken et al. |
| 2002/0195718 | A1 | 12/2002 | Imasu et al. |
| 2003/0027377 | A1 | 2/2003 | Owens |
| 2003/0116866 | A1 | 6/2003 | Cher'Khng et al. |
| 2003/0193088 | A1 | 10/2003 | Hall et al. |
| 2004/0004292 | A1 | 1/2004 | Hsieh et al. |
| 2004/0084771 | A1 | 5/2004 | Bolken et al. |
| 2004/0164412 | A1 | 8/2004 | Bolken et al. |
| 2004/0200885 | A1 | 10/2004 | Derderian |
| 2004/0212067 | A1 | 10/2004 | Wang |
| 2005/0019983 | A1 | 1/2005 | Bolken et al. |
| 2005/0026327 | A1 | 2/2005 | Hall et al. |

FOREIGN PATENT DOCUMENTS

| | | |
|---|---|---|
| JP | 09-232375 | 9/1997 |
| JP | 2003-234435 | 8/2003 |
| KR | 2001027290 | 4/2001 |

* cited by examiner

SEMICONDUCTOR INTEGRATED CIRCUIT PACKAGE HAVING ELECTRICALLY DISCONNECTED SOLDER BALLS FOR MOUNTING

RELATED APPLICATIONS

This application is a Divisional of U.S. application Ser. No. 11/428,625, filed Jul. 5, 2006 now U.S. Pat. No. 7,342,319, which is a Divisional of U.S. application Ser. No. 10/123,827, filed Apr. 15, 2002, now issued as U.S. Pat. No. 7,276,802, which are incorporated herein by reference.

FIELD OF THE INVENTION

The present invention relates to semiconductor integrated circuit (IC) packaging. In particular it relates to a board-on-chip (BOC) configuration using electrically disconnected solder balls for mounting a die to a substrate.

BACKGROUND OF THE INVENTION

The art of packaging ICs has continued to evolve and today represents a tremendous engineering challenge as ICs become smaller and more transistor dense. The packages encase many varieties of ICs, such as microprocessors, application specific ICs, cache and system memory, and range from packaging a single ICs to multiple ICs. No matter which type of package is used, the considerations for packaging are all generally the same. For example, packages are desired that are relatively inexpensive, are mechanically stable, are properly sized and can reliably distribute electric signals between various circuits and components while removing unwanted heat and offering protection in hostile environments. As expected, a trade-off exists between simultaneously being able to optimize each of the above considerations.

In conventional BOC package configurations, an IC in the form of a die is secured to a printed circuit board (PCB) by means of a two-sided tape that is sandwiched between the die and PCB. After curing, the die is electrically connected to the PCB via wire bonding and over-molded with an epoxy molding compound to form a complete package. The over-molding is typically performed in a molding cavity under high temperature and pressure conditions, such as 180° C. and 1000 psi, where the epoxy molding compound is forced to fill crevices in and around the wire bonds, the die and the PCB. During cooling, however, tremendous thermal mismatch occurs between all the foregoing mentioned structures which mechanically stresses the package. As a result, silica filler in the epoxy molding compound (typically 80-90% by weight) often impinges upon the die and the PCB and frequently mechanically and/or electrically compromises the package.

Thereafter, manufacturers typically perform package testing. Some of the tests are performed according to convention, such as the JEDEC standard tests, where assessment of a package's moisture sensitivity, thermal shock and temperature cycle, to name a few, is undertaken. The tape, however, is notoriously known for becoming de-laminated from one or both of the die and the PCB during such tests. Not only does de-lamination result in an inferior package, it also severely limits a manufacturer's ability to market its product since many IC packages are marked according to what level of JEDEC test was passed. For example, with level 1 being the best and level 4 being the worst, an IC package marked as a level 3 means it passed the level 3 test but failed the level 2 test. Some manufacturers even consider the tape to be the most limiting factor in all JEDEC testing.

Accordingly, the packaging arts desire an efficaciously formed package having improved thermal properties that are capable of achieving a higher pass rate during testing.

DETAILED DESCRIPTION OF THE PREFERRED EMBODIMENTS

In the following detailed description of the preferred embodiments, reference is made to the accompanying drawings which form a part hereof, and in which is shown by way of illustration, specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention. The terms die and substrate used in this specification includes any base semiconductor structure such as silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. The following detailed description is, therefore, not to be taken in a limiting sense, and the scope of the present invention is defined only by the appended claims and their equivalents.

The following description and figures use a reference numeral convention where the first digit of the reference numeral corresponds to the figure and the following two digits correspond to like elements throughout the specification. For example, the die having electrically disconnected solder balls has a reference number of 102, 202, 302, etc. corresponding to the die X02 in FIGS. 1, 2, 3, etc. where X is the number of the figure in which the reference numeral appears.

Figure 1A:
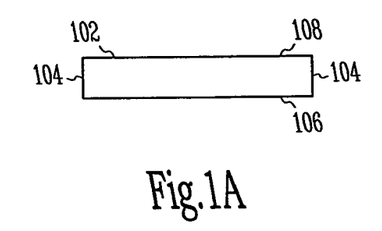
FIG. 1A is an end view in accordance with the teachings of the present invention of a die to be mounted to a substrate.
Figure 2A:
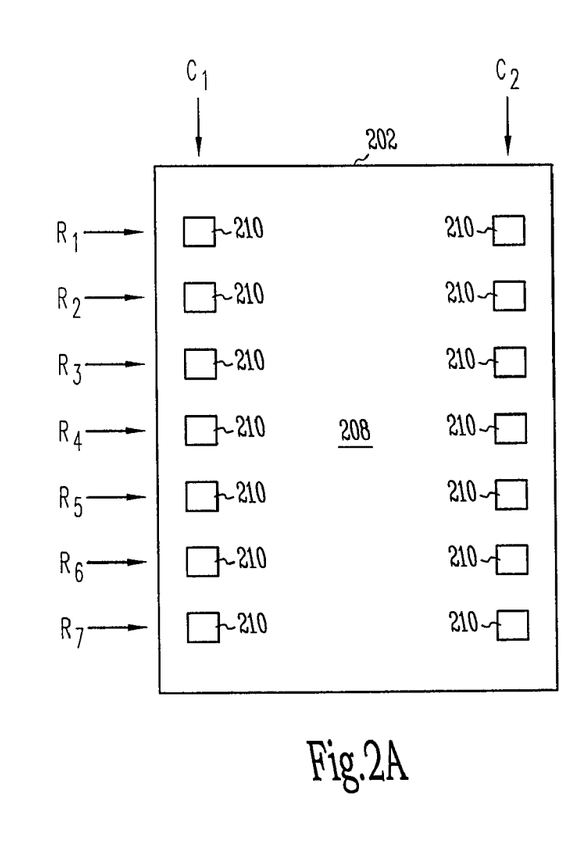
FIG. 2A is a top view in accordance with the teachings of the present invention of a die having columnar and row solder ball pads.
Figure 2B:
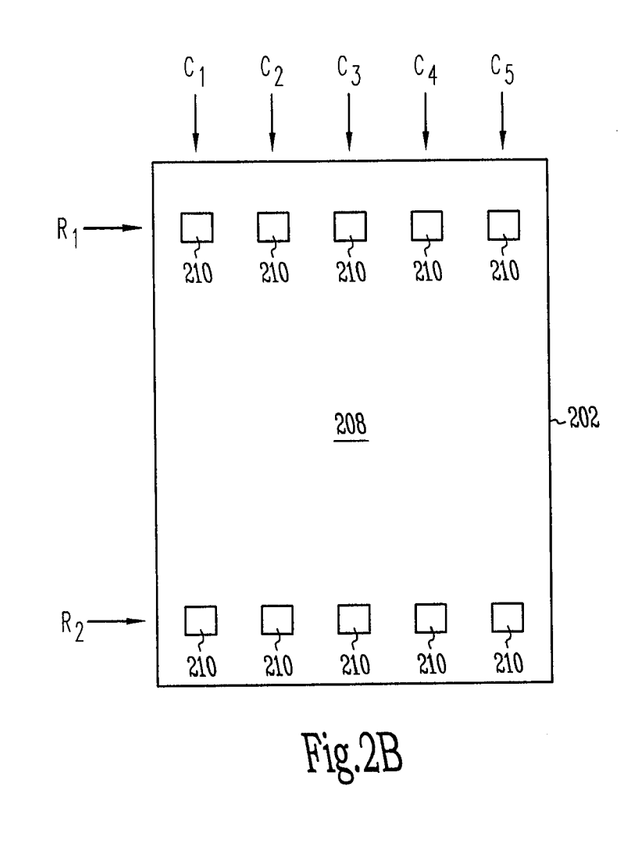
FIG. 2B is a top view in accordance with the teachings of the present invention of a die having alternatively arranged columnar and row solder ball pads.

With reference to FIG. 1A, a die 102 to be fabricated into an IC package with electrically disconnected solder balls is shown in end view. The die has sides 104, a bottom 106 and a circuit side 108. As is known, a die was originally one unit of perhaps a thousand dies of a wafer (not shown) separated on the wafer from other units by scribe or saw lines and physically separated from each other by either scribing or sawing the wafer along their respective lines. Often time dies are interchangeably referred to as chips. In some parts of the country, dies are referred to as bars. All terms of art are embraced by this invention. While not required to be any particular size, for reference purposes, the die in one embodiment is in a range from about 300 to about 150 microns thick.

Figure 1B:
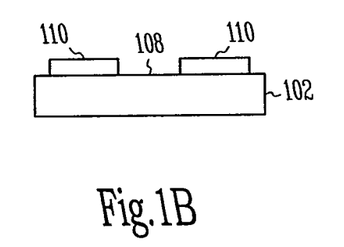
FIG. 1B is an end view in accordance with the teachings of the present invention of a die having solder ball pads in a processing step subsequent to FIG. 1A.

In FIG. 1B, the die 102 has one or more solder ball pads 110 (two shown) formed on the circuit side 108 of the die. In one embodiment, the solder ball pads are formed by a series of sequential manufacturing processes including deposition of a thin film layer across the surface of the die, masking or patterning the layer in the appropriate area on the die where the solder ball pads are to be formed, and etching the layer so that only the solder ball pads remain.

Some deposition techniques embraced herein, include, but are not limited to, any variety of chemical vapor depositions (CVD), physical vapor depositions (PVD), epitaxy, evaporation, sputtering or other known or hereinafter developed techniques. Specific CVD techniques include low pressure (LP) ones, but could also be atmospheric pressure (AP), plasma enhanced (PE), high density plasma (HDP) or other. Some masking techniques include resist or rigid metal masks that are configured as a clear-field or dark-field mask, as those terms as well understood by skilled artisans. Some particular etching techniques embraced by this invention include, but are not limited to, any variety of wet etches including immersion or spray, or dry etches including plasma, barrel or planar, ion milling, reactive ion etches (RIE) or deep RIE.

Figure 1C:
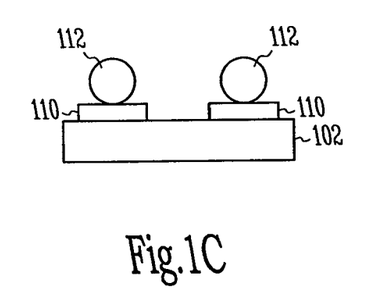
FIG. 1C is an end view in accordance with the teachings of the present invention of a die having electrically disconnected solder balls in a processing step subsequent to FIG. 1B.

The solder ball pads 110 serve as the basis for wetting and adhesion of a to-be-formed solder ball 112 as shown in FIG. 1C. In one embodiment, the solder ball pads are formed of a multi-layer stack based on a two-metal composition of Cr/Cu that is optimized for sustained adhesion to avoid de-lamination. The copper interacts with the solder during well known reflow techniques while the chromium (solder inert) forms a sort of three-dimensional mesh to hold the solder in place. In a more particular embodiment, the multi-layer stack includes Cr/CrCu/Cu/Au where the gold protects the copper against oxidation. Although no particular dimensions of the solder ball pad are required by this invention, a 150 micron thick pad serves to provide an example.

Normally, a solder ball, such as in a flip-chip configuration, provides a mechanical strength and appropriate clearance distance between the two or more surfaces being joined and the electrical interconnection between such surfaces. However, in the present invention, it should be appreciated the solder balls are uniquely electrically disconnected from any circuit formed on the die. The reason is because the solder ball pads are formed on the die on the circuit side of the die in an area where the circuit has no electrical input/output (I/O) interconnection. In this manner, the solder balls remain electrically isolated from the circuit. As will become more apparent from the following description, this will allow the die to be temporarily held in position by the solder balls until such time as it is electrically connected and more permanently affixed. As such, because of the temporary nature of the solder balls and their electrical disconnection from the die circuit, they can be considered as "dummy" or "simulated" solder balls.

In one embodiment, the solder balls are comprised of a Pb/Sn metal composition and are deposited in accordance with known evaporation techniques. Ninety-five/five percent solder balls, or 95Pb/5 Sn, are one particular embodiment of the invention. Eutectic solder is another embodiment. Like the solder ball pads, no particular dimension of the solder ball is required. As a representative example, however, the solder balls can be about 150 microns in diameter. As such, the ratio of solder ball pad to solder ball is on the order of about 1:1. In other embodiments, the ratio is 2:1 or 1:2 or other.

Figure 1D:
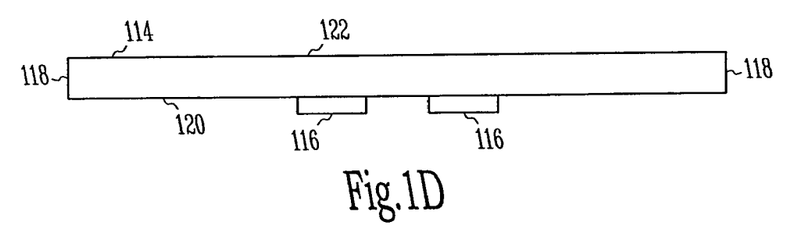
FIG. 1D is an end view in accordance with the teachings of the present invention of a substrate to be mounted to a die.
Figure 12:
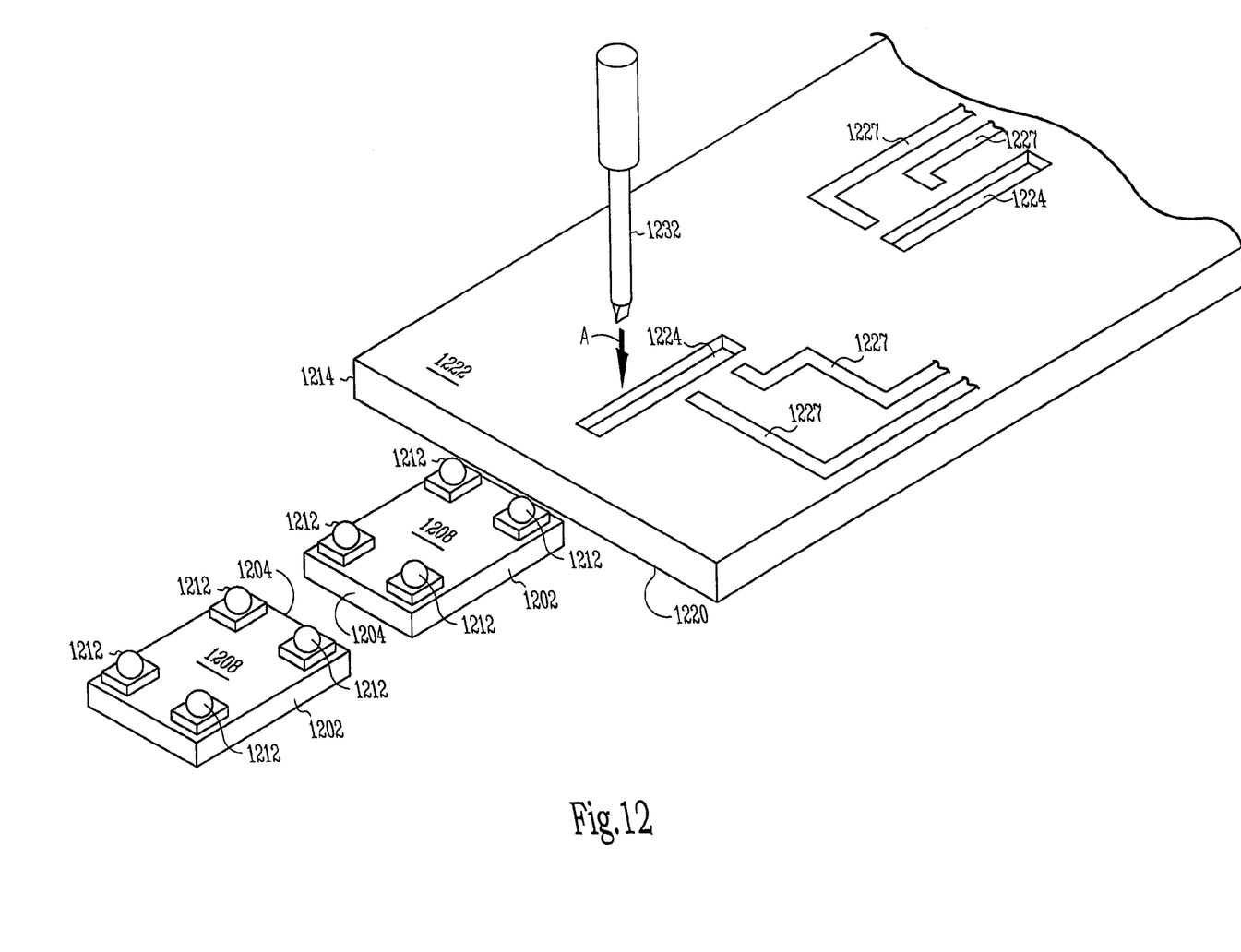
FIG. 12 is a perspective view of a plurality of dies to be connected to a printed circuit board in an alternative embodiment of the present invention.

In FIG. 1D, a substrate 114 to be joined with the die is provided. It contains one or more substrate pads 116 (two shown) and has sides 118, an undersurface 120 and a top 122. One or more slots, shown as 1224 in the perspective view of FIG. 12, are disposed in the thickness of the substrate between the top and the undersurface for providing well known mounting access between the circuit of the die and the conductive traces of the substrate. For reference purposes, the substrate in one embodiment is slightly thicker than the die and is about 200 microns thick. In another embodiment of the invention, the substrate is a printed circuit board (PCB) and will be referred interchangeably with the substrate hereinafter. The substrate pads are not required to be of any particular dimension or chemical composition, but for reference purposes they will likely be similar in size and composition to the solder ball pads.

Figure 1E:
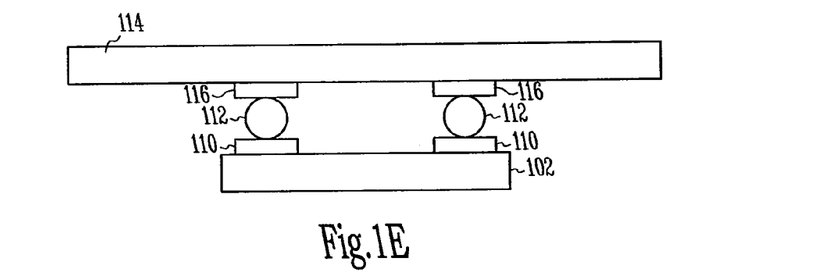
FIG. 1E is an end view in accordance with the teachings of the present invention of a die having electrically disconnected solder balls mounted to a substrate in a processing step subsequent to FIG. 1D.
Figure 1F:
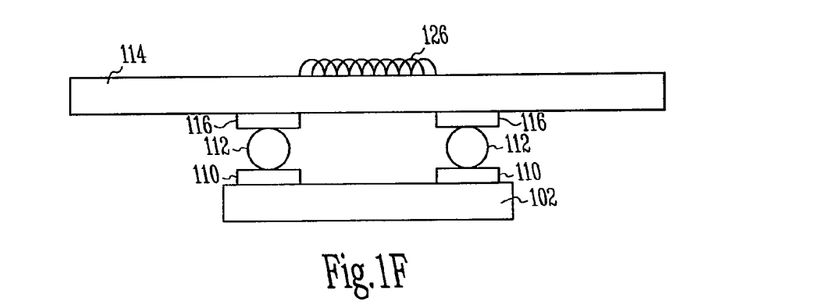
FIG. 1F is an end view in accordance with the teachings of the present invention of a die having electrically disconnected solder balls electrically wire bonded to a substrate in a processing step subsequent to FIG. 1E.

In FIG. 1E, the PCB 114 is brought into proximity with the die 102 and the solder balls 112 are aligned and connected with the substrate pads 116 of the substrate. Alignment of the die and substrate can be accomplished with the assistance of well known machines such as pick-and-place machines. Connection between the solder balls and the substrate pads includes, but is not limited to, well know solder reflow techniques. It should be appreciated that once connected, the die and the substrate are at least temporarily connected to one another for the purposes of electrically connecting the circuit of the die to the substrate as shown in FIG. 1F. In particular, a plurality of wires 126 extending from the circuit of the die are wire bonded to the printed circuit board to necessarily complete the electrical interconnection there between. In the embodiment of FIG. 12, as will be described in greater detail below, the wires (not shown) are connected up through a slot 1224 in the printed circuit board 1214 from the circuit of the die 1202 to any of the conductive traces 1227 (greatly exaggerated) disposed on the top 1227 of the printed circuit board.

The wires 126 in one embodiment are gold wire strands with about a 1 mil. diameter. Typically, gold is the best known conductor at room temperature and performs excellently as a heat conductor while resisting oxidation and corrosion. Alternatively, the wires could be aluminum or palladium because of their relative cheap cost in comparison to gold or other suitable conductor or other suitable diameter range.

Figure 1G:
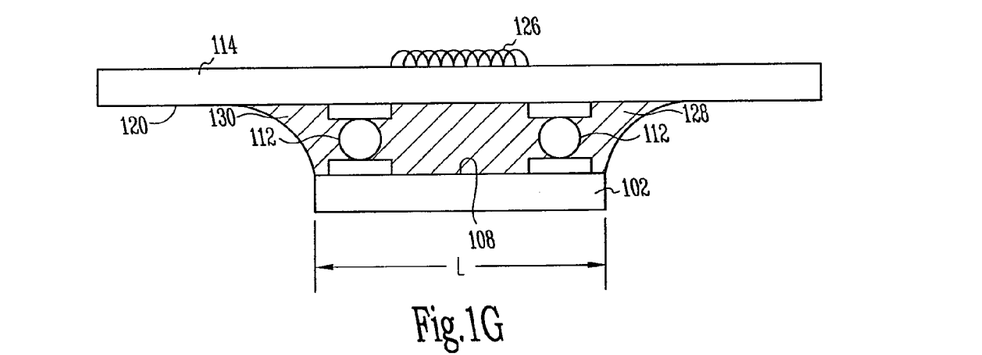
FIG. 1G is an end view in accordance with the teachings of the present invention of a die having electrically disconnected solder balls mounted to a substrate and an underfill coating in a processing step subsequent to FIG. 1F.
Figure 1H:
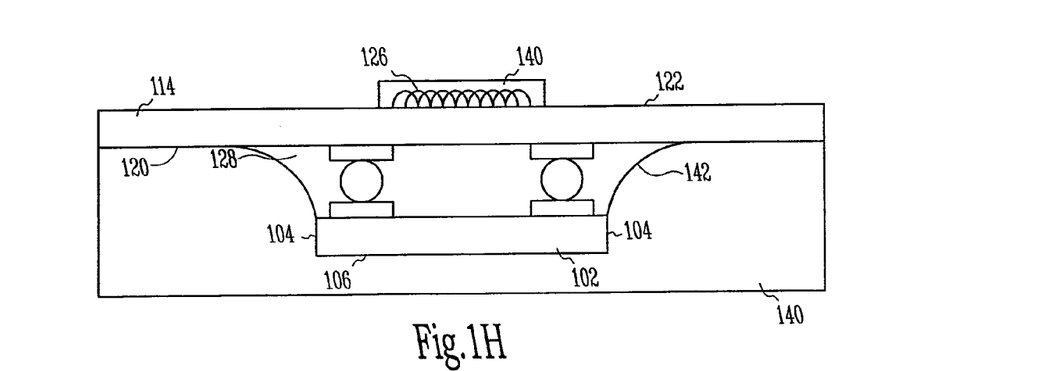
FIG. 1H is an end view in accordance with the teachings of the present invention of an overmolding compound disposed in a processing step subsequent to FIG. 1G.

In FIG. 1G, an additional, more permanent fixing of the die to the substrate is accomplished by first disposing an underfill material 128 between the die 102 and the substrate 114 and then curing the underfill material. In the embodiment shown, the underfill material stretches from the undersurface 120 of the substrate 114 to the circuit side 108 of the die 102. The underfill material is lengthwise, in the same direction as the length, L, of the die, longer in a region 130 near the undersurface 120 of the substrate 114 than near the circuit side 108 of the die. It is disposed substantially about a periphery of all solder balls 112. In one embodiment, the coefficient of thermal expansion (CTE) of the underfill material is substantially equal to the CTE of the solder balls 112 to prevent thermal mismatch between the two structures during manufacturing, thermal testing and ultimate consumer usage. Two particular underfill materials found to be suitable for use with this invention are sold by Nagase under the description T693-R3002-EXV3 and T693-R3001-EXV3. They are sold in liquid form and both have a syrup-like viscosity at room temperature. They are thermoset materials and have been known to adequately thermally cure in environments of about 150° C. for about 15 to 30 minutes. Once cured, it should be appreciated that the die and substrate are now substantially permanently affixed or connected to one another and the prior art problems of tape de-lamination are avoided. Other suitable underfill materials include, but are not limited to, ultraviolet curable materials, microwave-oven-type curable materials or other materials now known or later invented. The particular volume of the underfill material is a function of package application and typically depends upon die size, solder ball size, volume of solder balls, thickness of substrate and solder ball pads, etc. It will be appreciated that the use of the foregoing described underfill material will essentially eliminate the large use of silica filler which so detrimentally impinged the PCB and the die during manufacturing and caused electrical and/or mechanical compromise in prior art packages. Silica filler in these embodiments is more on the order of about 30 percent by weight.

One particular method for dispensing the underfill material is shown in FIG. 12. In particular, a needle 1232 connected to an appropriate source of underfill material dispenses the underfill material through a slot 1224 (down as arrow A shows) in the printed circuit board 1214 onto the circuit side 1208 of the die 1202 at a time when the dies are proximately arranged with the printed circuit board. Since this invention may be extended beyond the use of a single die to a single substrate to a plurality of dies 1202 being connected to the substrate, it will be appreciated that the underfill material will in one embodiment be dispensed such that all the solder balls 1212 of the dies 1202 are substantially surrounded by the underfill material and will extend from the tops 1208 of all dies 1202 to the undersurface 1220 of the substrate 1214. The underfill material will likely also be found between adjacent dies along adjacent sides 1204.

To complete the integrated circuit package (FIG. 1H), an overmolding compound 140 is disposed into all crevices and substantially about all exposed sides 104 and the bottom 106 of the die 102 and about the exposed periphery 142 of the underfill material 128 and along the undersurface 120 of the substrate. The overmolding compound is also disposed about the plurality of wires 126 along the top 122 of the substrate 114 used in wire bonding the circuit of the die to the substrate 114. This process will typically take place in a molding cavity which gives the package its ultimate shape. It is performed under relatively high pressure and temperatures. In one embodiment, the environment is about 1000 p.s.i. and about 180° C. Thereafter, the package is cooled. Exemplary overmolding compounds include, but are not limited to, any epoxy or epoxy based materials. It is well known that epoxies provide relatively low weight, low material cost, manufacturing efficiency and good moisture impermeability.

It will be appreciated that various physical arrangements of the solder ball pads on the die, and ultimately the arrangement of the solder balls themselves, can assume many varieties. For example, in FIGS. 2A and 2B, the solder ball pads 210 are arranged on the circuit side 208 of the die 202 in a rectangular grid-like array as a plurality of columns (Cx) and rows (Rx), where x ranges upward from one until a number, dependent upon size of the solder ball pad and the size of the die, is reached where the die is filled. As a practical constraint, however, one embodiment of the present invention limits the number of solder ball pads on the die in a range from about 10 to about 30.

Figure 3A:
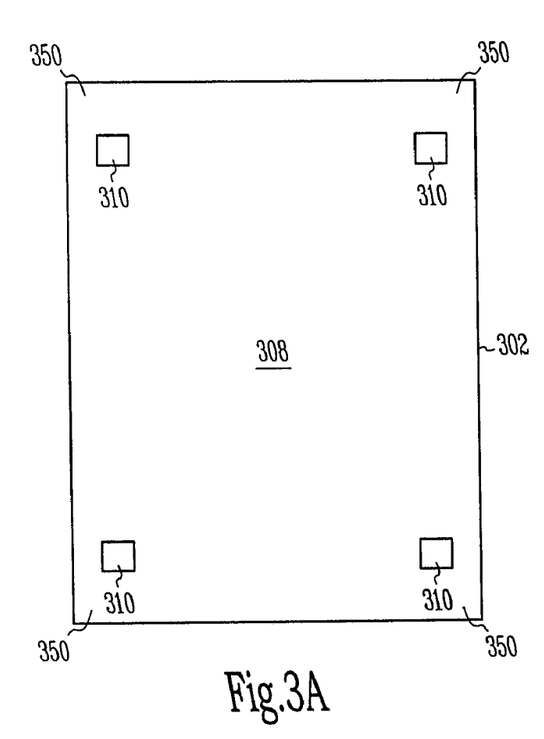
FIG. 3A is a top view in accordance with the teachings of the present invention of a die having corner arranged solder ball pads.
Figure 3B:
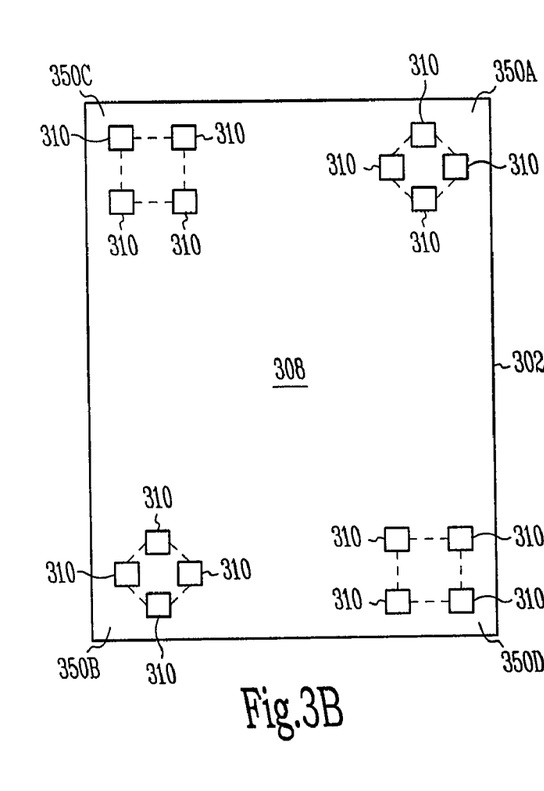
FIG. 3B is a top view in accordance with the teachings of the present invention of a die having pluralities of corner arranged solder ball pads.

In FIGS. 3A and 3B, the solder ball pads 310 are arranged on the circuit side 308 of the die 302 in corner regions 350 thereof. In FIG. 3A, single solder ball pads are shown in the corner region while in FIG. 3B, pluralities of solder ball pads 310 are shown. In corner regions 350A and 350B, the plurality of solder ball pads are shown in a diamond-like arrangement as shown by the dashed lines. In corner regions 350C and 350D, the pluralities are shown in a square box-like arrangement. It should be appreciated that although described as corner-arranged solder ball pads, the pads themselves can still form one or more rows or columns of pads.

Figure 4A:
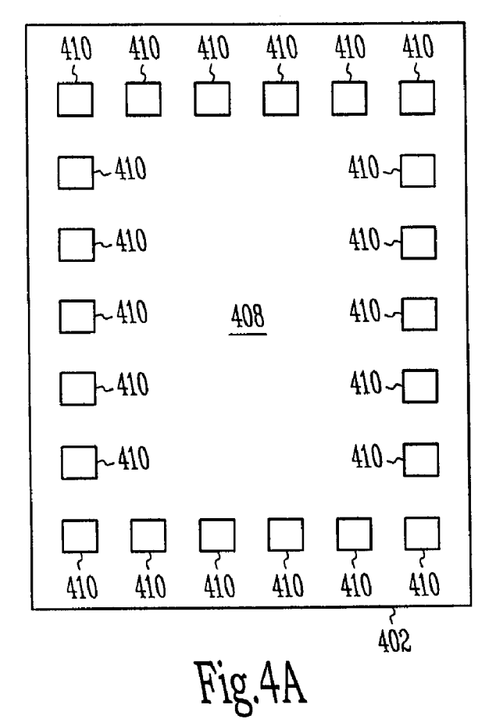
FIG. 4A is a top view in accordance with the teachings of the present invention of a die having perimeter arranged solder ball pads.
Figure 4B:
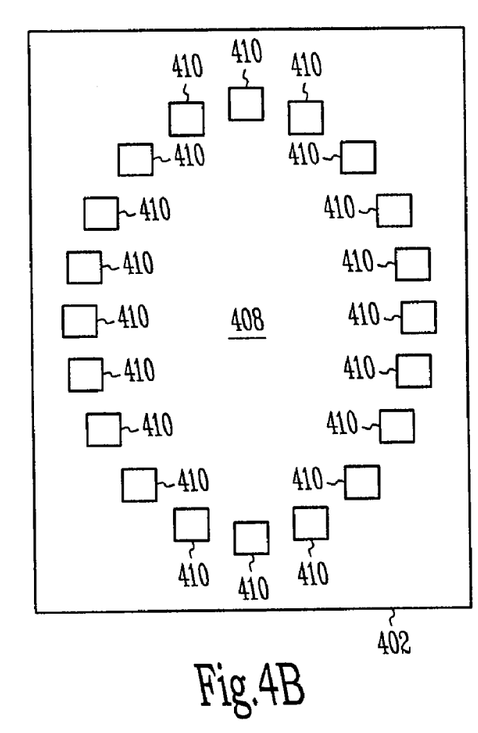
FIG. 4B is a top view in accordance with the teachings of the present invention of a die having alternatively arranged perimeter solder ball pads.

In FIGS. 4A and 4B, the solder ball pads 410 are arranged on the circuit side 408 of the die 402 about a perimeter or periphery of the die. In FIG. 4A, the solder ball pads are arranged as a rectangular box-like configuration about the periphery of the die whereas in FIG. 4B, they are arranged in a oval-like configuration. It should be appreciated that although described as periphery-arranged solder ball pads, the pads themselves can still form one or more rows or columns of pads or occupy a corner region with one or more pads.

Figure 5:
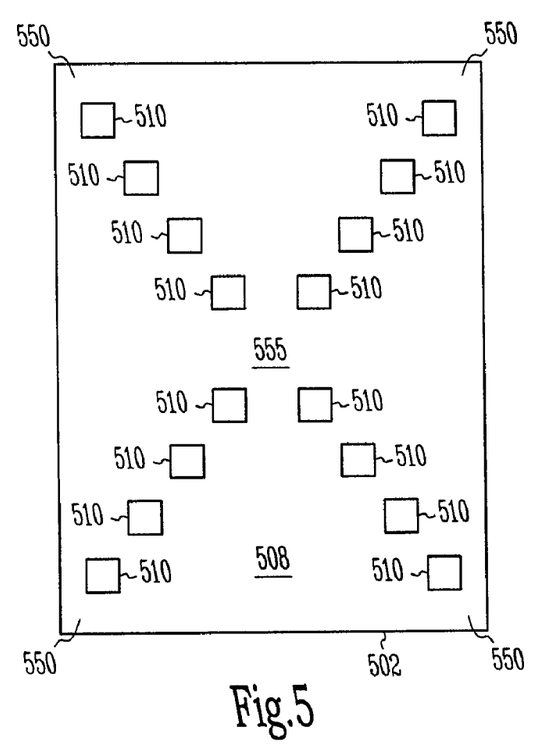
FIG. 5 is a top view in accordance with the teachings of the present invention of a die having diagonally arranged solder ball pads.

In FIG. 5, the solder ball pads 510 are arranged on the circuit side 508 of the die 502 in a diagonal manner beginning in the corner regions 550 and extending linearly towards a center region 555. It should be appreciated that although described as diagonally-arranged solder ball pads, the pads themselves can still form one or more rows or columns of pads, occupy a corner region or periphery with one or more pads.

Figure 6:
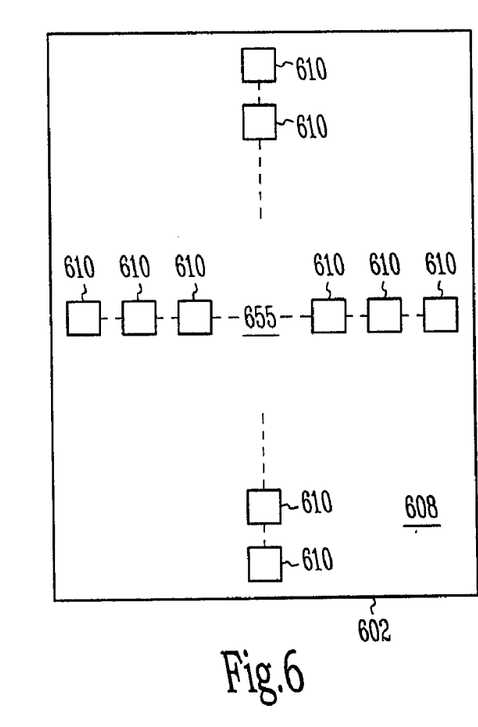
FIG. 6 is a top view in accordance with the teachings of the present invention of a die having crossly arranged solder ball pads.

In FIG. 6, the solder ball pads 610 are arranged on the circuit side 608 of the die 602 in a crossly manner as indicated by the dashed lines that would cross one another somewhere in the vicinity of center region 655. It should be appreciated that although described as crossly-arranged solder ball pads, the pads themselves can still form one or more rows or columns of pads, occupy a corner region or periphery with one or more pads.

It will be further appreciated that all the foregoing described embodiments can be mixed and matched with one another to achieve even still further solder ball pad embodiments than those shown. With the assistance of this invention, those skilled in the art can envision still other arrangements without departing from the scope of the invention. For example, in all embodiments, it is also possible to arrange the pads in such a manner as to slightly offset themselves from one another thereby departing from the generally linear arrangements to achieve generally stair-step profiles or to closely arrange two or three or more substantially parallel sets of solder ball pads.

In all previous embodiments shown, it should be apparent that the solder ball pads were arranged to generally avoid the center region of the particular die upon which it was placed. This is because as the die and the substrate are brought into proximity with one another to connect the solder balls to the substrate pads, the slots of the substrate generally exist above the center region of the dies. See FIG. 12 to understand this conceptually (slot 1224 is avoided by solder balls 1212 in corner regions of the dies 1202). As such, the solder ball pads are shown in a manner that avoids the slot of the substrate or, in other words, are disposed on the die not adjacent to the slot. It will be appreciated, however, that in the event the substrates have slots arranged in areas to receive the die other than the center region, the die will have solder ball pads placed accordingly in other ways. Even further, in the event the substrates to which the dies are connected contain absolutely no slots the solder ball pad arrangement, and ultimately the solder ball arrangement, may exist anywhere on the surface of the die so long as the solder balls are electrically disconnected from the circuit.

So far, this invention has been described where the circuit side of the die is connected in a manner to face the substrate. As is known in the art, this is called a board-on-chip (BOC) package. It should be appreciated, however, that this invention is equally applicable to dies having their circuit sides disposed away or not facing the substrate. In this embodiment, the invention is considered as a chip-on-board (COB) package.

Still further, the present invention may be practiced with other well known packaging techniques. For example, it is possible to combine this technique with flip-chip packages. In such an embodiment, the inventive package would not only include electrically disconnected dummy solder balls for mounting purposes but would include solder balls or solder bumps electrically connected to the circuit of the die.

Aside from the other advantages already mentioned, in some instances it is believed the preceding described package(s) will allow passage of the more stringent JEDEC standard tests, thereby achieving higher level markings than two-sided tape arrangements of the prior art, and will enhance package marketability.

In the remaining figures, and without strict adherence to the previous numbering convention, dies will be described as they are used in variety of applications. Some of these dies, it will be appreciated, are packaged in accordance with the foregoing described invention relating to electrically disconnected solder balls used for mounting purposes. The dies also contain other integrated circuit elements such as capacitors, transistors, lines, interconnects, plugs, pads, I/O connections, insulators and other known elements as part of the die circuit previously mentioned.

Figure 7:
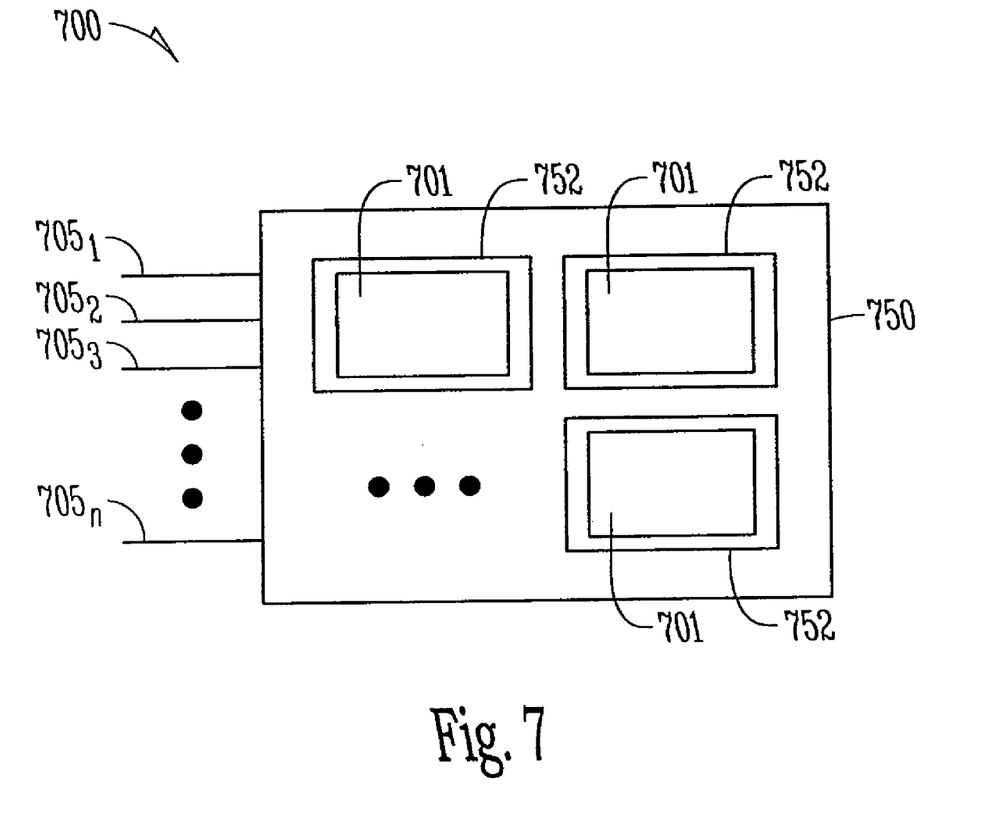
FIG. 7 is a diagrammatic view of a circuit module in accordance with the teachings of the present invention.

As shown in FIG. 7, which is similar to FIG. 12, two or more dies 701 having electrically disconnected solder balls in accordance with the present invention can be combined, with or without protective casing, into a circuit module 700 to enhance or extend the functionality of an individual die 701. Circuit module 700 may be a combination of dies 701 representing a variety of functions, or a combination of dies 701 containing the same functionality. In one embodiment, circuit module 700 includes at least one socket, slot, recess or the like 752 into which the die 701 is received. Slot 752 in one embodiment is a circuit board 750. Slot 752, in another embodiment, represents a mount including land patterns. In any embodiment, dies 701 may be received by slot 752 in a pick-and-place operation by suitable pick-and-place machines.

Some examples of a circuit module 700 includes memory modules, device drivers, power modules, communication modems, processor modules and application-specific modules, and may include multilayer, multichip modules. Such modules will have a chip receiver in which a chip according to the present invention is inserted. Circuit module 700 may be a subcomponent of a variety of electronic systems, such as a clock, a television, a cell phone, a personal computer, an automobile, an industrial control system, an aircraft and others. Such modules will have a circuit module receiver in which a circuit module according to the present invention is inserted. Circuit module 700 will have a variety of leads 705$_1$ through 705$_N$ extending therefrom providing unilateral or bilateral communication and control in its particular application.

Figure 8:
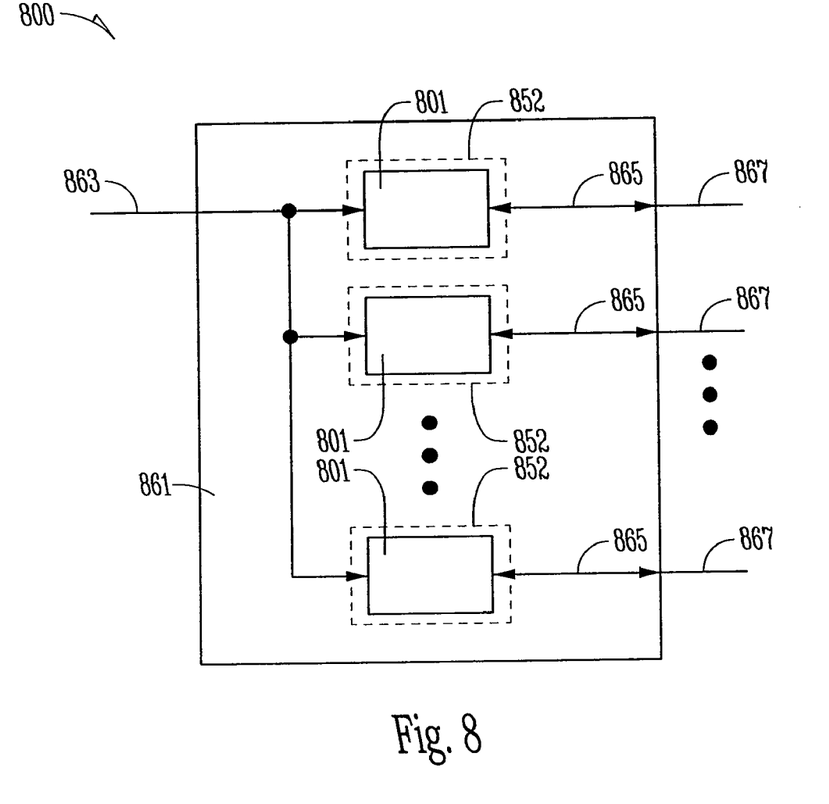
FIG. 8 is diagrammatic view of a memory module in accordance with the teachings of the present invention.

FIG. 8 shows one embodiment of a circuit module as memory module 800. Memory module 800 contains multiple memory devices 801 contained on support 861. In one embodiment, support 861 includes slots 852 for receiving memory devices 801. The number of memory devices generally depends upon the desired bus width and the desire for parity. Memory devices 801 include at least die having electrically disconnected solder balls packaged in accordance with the present invention. The support 861 includes sockets, slots, recesses or the like 852, each adapted to receive a memory device 801 and provide electrical communication between a bus and memory device 801. Memory module 800 accepts a command signal from an external controller (not shown) on a command link 863 and provides for data input and data output on data links 865. The command link 863 and data links 865 are connected to leads 867 extending from the support 815. Leads 867 are shown for conceptual purposes and are not limited to the position shown in FIG. 8.

Figure 9:
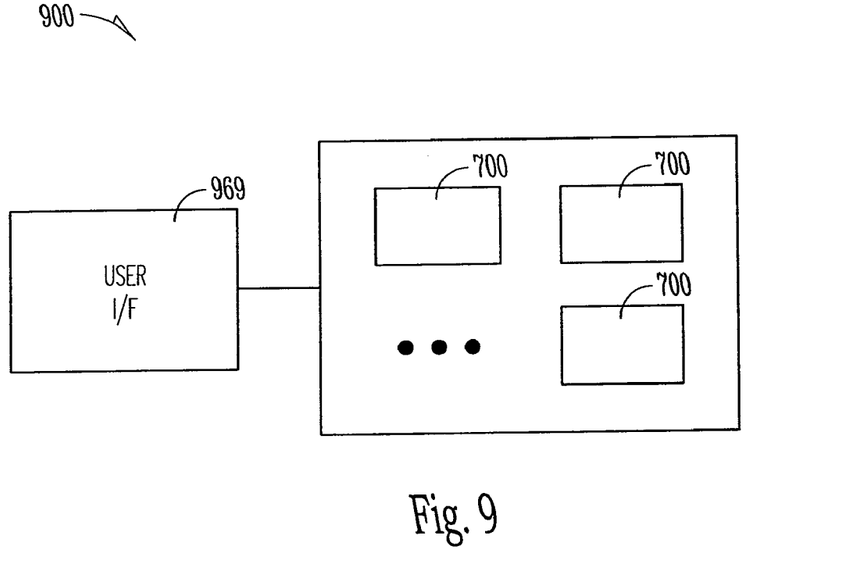
FIG. 9 is a diagrammatic view of an electronic system in accordance with the teachings of the present invention.

FIG. 9 shows one embodiment of an electronic system 900 containing one or more circuit modules 700. At least one of the circuit modules 700 contains a die having electrically disconnected solder balls packaged in accordance with the present invention. Electronic system 900 generally contains a user interface 969. User interface 969 provides a user of the electronic system 900 with some form of control or observation of the results of the electronic system 900. Some examples of user interface 969 include the keyboard, pointing device, monitor or printer of a personal computer; the tuning dial, display or speakers of a radio; the ignition switch, gauges or gas pedal of an automobile; and the card reader, keypad, display or currency dispenser of an automated teller machine. User interface 969 may further describe access ports provided to electronic system 900. Access ports are used to connect an electronic system to the more tangible user interface components previously exemplified. One or more of the circuit modules 700 may be a processor providing some form of manipulation, control or direction of inputs from or outputs to user interface 969, or of other information either preprogrammed into, or otherwise provided to, electronic system 900. In another embodiment, electronic system 900 includes memory modules 800. As will be apparent from the lists of examples previously given, electronic system 900 will often be associated with certain mechanical components (not shown) in addition to circuit modules 700 and user interface 969. It will be appreciated that the one or more circuit modules 700 in electronic system 900 can be replaced by a single integrated circuit. Furthermore, electronic system 900 may be a subcomponent of a larger electronic system.

Figure 10:
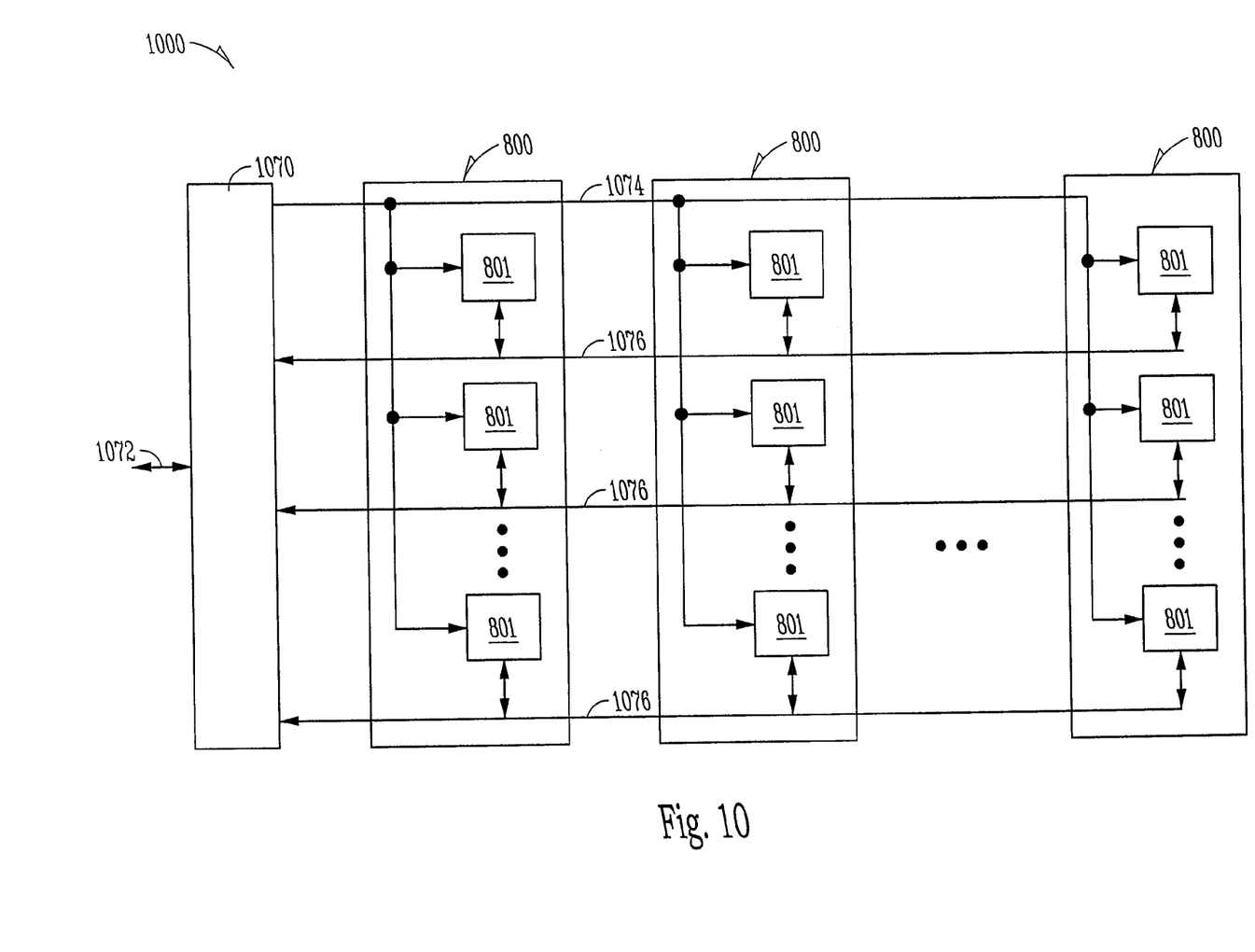
FIG. 10 is a diagrammatic view of an embodiment of an electronic system in accordance with the teachings of the present invention.

FIG. 10 shows one embodiment of an electronic system as memory system 1000. Memory system 1000 contains one or more memory modules 800 and a memory controller 1070. At least one of the memory modules 800 includes a die having electrically disconnected solder balls packaged in accordance with the present invention. Memory controller 1070 provides and controls a bidirectional interface between memory system 1000 and an external system bus 1072. Memory system 1000 accepts a command signal from the external bus 1072 and relays it to the one or more memory modules 800 on a command link 1074. Memory system 1000 provides for data input and data output between the one or more memory modules 800 and external system bus 1072 on data links 1076.

Figure 11:
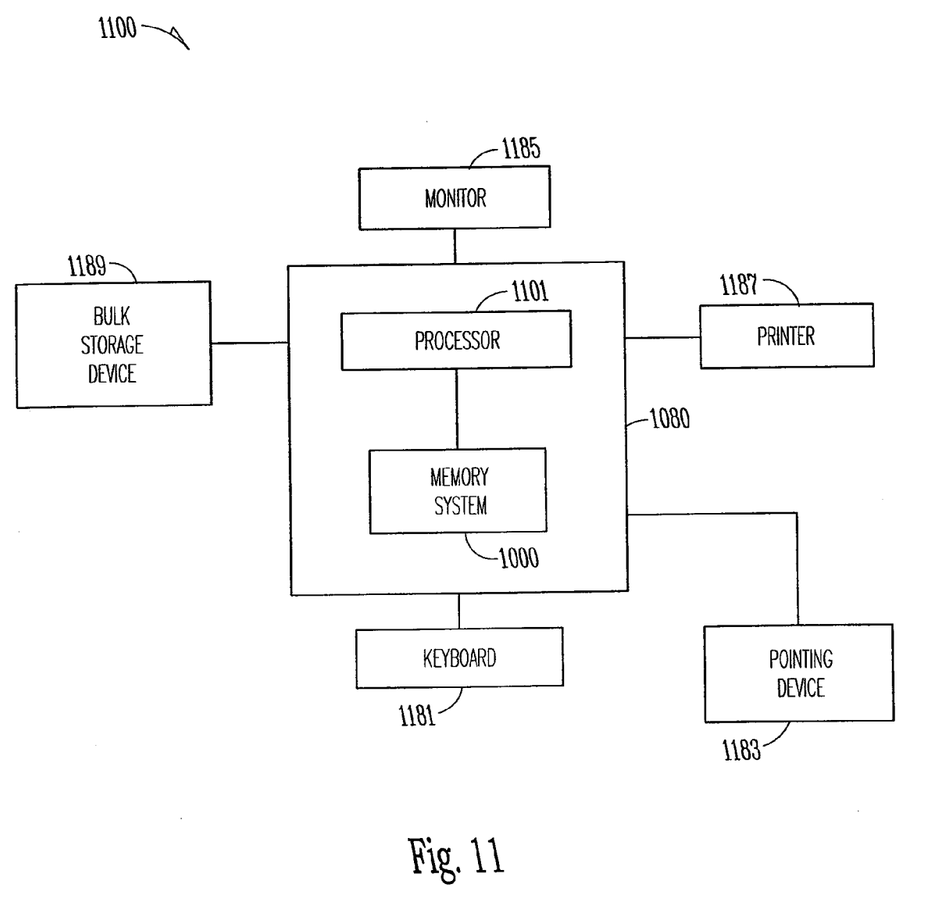
FIG. 11 is a diagrammatic view of a computer system in accordance with the teachings of the present invention.

FIG. 11 shows a further embodiment of an electronic system as a computer system 1100. Computer system 1100 contains a processor 1101 and a memory system 1000 housed in a computer unit 1080. In one embodiment, the memory system 1000 includes a die packaged in accordance with the present invention. In another embodiment, processor 1101 includes a die packaged in accordance with the present invention. Computer system 1100 is but one example of an electronic system containing another electronic system, i.e., memory system 1000, as a subcomponent. Computer system 1100 optionally contains user interface components. Depicted in FIG. 11 are a keyboard 1181, a pointing device 1183 such as a mouse, trackball, or joystick, a monitor 1185, a printer 1187 and a bulk storage device 1189. It will be appreciated that other components are often associated with computer system 1100 such as modems, device drivers, additional storage devices, etc. These other components, in still another embodiment, include at least one die package having dummy solder balls of the present invention. It will be appreciated that the processor 1101 and memory system 1000 of computer system 1100 can be incorporated on a single integrated circuit. Such single package processing units reduce the communication time between the processor and the memory circuit.

CONCLUSION

The above structures and methods have been described, by way of example, and not by way of limitation, with respect to a semiconductor IC package having electrically disconnected solder balls useful during the mounting a die to a printed circuit board.

In particular, packages are taught that connect a plurality of solder balls between a plurality of solder ball pads of a die and substrate pads of a printed circuit board. The solder balls are electrically disconnected from any circuit of the die and are used to temporarily hold the die in position with respect to the printed circuit board until the circuit is wire bonded and an underfill material is cured between the die and the printed circuit board to more permanently connect them together. The underfill material is selected to have a coefficient of thermal expansion (CTE) that is substantially equal to the CTE of the solder balls. In this manner, the thermal mismatch of the prior art is avoided. The de-lamination problems associated with two-sided tapes are also avoided since the underfill material is selected to be better suited in joining a die with a printed circuit board. The package is completed by disposing an overmolding compound about the die and the underfill material and about the wire bonds to protect the package from moisture, thermal swings, etc., in hostile environments.

The present invention has been particularly shown and described with respect to certain preferred embodiment(s). However, it will be readily apparent to those skilled in the art that a wide variety of alternate embodiments, adaptations or variations of the preferred embodiment(s), and/or equivalent embodiments may be made without departing from the intended scope of the present invention as set forth in the appended claims. Accordingly, the present invention is not limited except as by the appended claims.

What is claimed is:

1. An electronic system, comprising:

a processor; and a memory system coupled to the processor, wherein the memory system is contained in a package having:

a plurality of solder balls;

a printed circuit board having a plurality of substrate pads;

a plurality of dies each having a memory circuit and a plurality of solder ball pads on a circuit side thereof, each of the plurality of solder balls being connected to one of the plurality of substrate pads and one of the plurality of solder ball pads, one or more of the plurality of solder balls being electrically disconnected from the circuit; and wire bonding wires electrically connecting the memory circuit of the plurality of dies to the printed circuit board.

2. The system of claim 1, wherein the package further includes an underfill material between and connecting each of the plurality of dies to the printed circuit board.

3. The system of claim 2, wherein the package further includes an overmolding compound disposed substantially about each of the plurality of dies and the underfill material.

4. The system of claim 1, wherein one of the memory circuits further includes at least one memory module and a memory controller.

5. The system of claim 3, wherein the overmolding compound includes an epoxy-based material.

6. The system of claim 1, wherein the plurality of solder ball pads are crossly arranged on the die.

7. The system of claim 1, wherein at least one of the solder ball pads is formed of a Cu/Cr metal composition.

8. The system of claim 1, wherein at least one of the solder balls is formed of a Pb/Sn metal composition.

9. An electronic system, comprising:

a processor; and a memory system coupled to the processor, wherein the memory system is contained in a package having:

a plurality of solder balls;

a printed circuit board having a plurality of substrate pads;

a plurality of dies each having a memory circuit and a plurality of solder ball pads on a circuit side thereof, each of the plurality of solder balls being connected to one of the plurality of substrate pads and one of the plurality of solder ball pads, one or more of the plurality of solder balls being electrically disconnected from the circuit;

wire bonding wires electrically connecting the memory circuit of the plurality of dies to the printed circuit board; and an underfill material between and connecting each of the plurality of dies to the printed circuit board, wherein the underfill material has a coefficient of thermal expansion that is substantially equal to the coefficient of thermal expansion of the solder balls.

10. The system of claim 9, wherein the package further includes an overmolding compound disposed substantially about each of the plurality of dies and the underfill material.

11. The system of claim 9, wherein one of the memory circuits further includes at least one memory module and a memory controller.

12. The system of claim 10, wherein the overmolding compound includes an epoxy-based material.

13. The system of claim 9, wherein the plurality of solder ball pads are crossly arranged on the die.

14. The system of claim 9, wherein at least one of the solder ball pads is formed of a Cu/Cr metal composition.

15. The system of claim 9, wherein at least one of the solder balls is formed of a Pb/Sn metal composition.

16. An electronic system, comprising:
a processor; and
a memory system coupled to the processor, wherein the memory system is contained in a package having:
a plurality of solder balls,
a printed circuit board having a plurality of substrate pads on a surface thereof;
a die having a memory circuit and a plurality of solder ball pads on a circuit side thereof, each of the plurality of solder balls connected to one of the plurality of substrate pads and one of the plurality of solder ball pads, one or more of the plurality of solder balls electrically disconnected from the circuit;
wire bonding wires electrically connecting the memory circuit to the printed circuit board; and
an underfill material between and connecting the die to the printed circuit board, the underfill material having a coefficient of thermal expansion that is substantially equal to the coefficient of thermal expansion of the solder balls.

17. The system of claim 16, further comprising an overmolding compound disposed substantially about the die and the underfill material.

18. The system of claim 17, wherein the overmolding compound includes an epoxy-based material.

19. The system of claim 16, wherein the underfill material includes an ultraviolet curable material.

20. The system of claim 16, wherein the underfill material includes a thermoset material.

* * * * *